(12) United States Patent
Chiu et al.

(10) Patent No.: US 7,638,874 B2
(45) Date of Patent: Dec. 29, 2009

(54) MICROELECTRONIC PACKAGE INCLUDING TEMPERATURE SENSOR CONNECTED TO THE PACKAGE SUBSTRATE AND METHOD OF FORMING SAME

(75) Inventors: Chia-Pin Chiu, Tempe, AZ (US); John P. Dirner, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 11/474,182

(22) Filed: Jun. 23, 2006

(65) Prior Publication Data

US 2007/0296071 A1    Dec. 27, 2007

(51) Int. Cl.
*H01L 23/34* (2006.01)
(52) U.S. Cl. .................. 257/713; 257/467; 257/E23.08; 438/54; 438/55; 361/717
(58) Field of Classification Search .................. 257/678, 257/690, 701, 702, 706, 707, 714, 718, 719, 257/E23.08; 361/687, 717–723
See application file for complete search history.

(56) References Cited

U.S. PATENT DOCUMENTS

| | | | | |
|---|---|---|---|---|
| 5,831,333 A | * | 11/1998 | Malladi et al. | ............... 257/712 |
| 6,092,926 A | * | 7/2000 | Still et al. | ................... 374/141 |
| 6,726,455 B2 | * | 4/2004 | Horng et al. | ................... 417/14 |
| 6,781,056 B1 | * | 8/2004 | O'Rourke et al. | ............ 174/535 |
| 2003/0147225 A1 | * | 8/2003 | Kenny et al. | ................. 361/764 |

OTHER PUBLICATIONS http://wps2a.semi.org/wps/portal/_pagr/135/_pa.135/745?&dFormat=application/msword&docNarne=P037178.

* cited by examiner

*Primary Examiner*—Lex Malsawma
*Assistant Examiner*—Robert Huber
(74) *Attorney, Agent, or Firm*—Blakely, Sokoloff, Taylor & Zafman LLP

(57) ABSTRACT

A microelectronic package, a method of forming the package and a system incorporating the package. The package includes a substrate; a die bonded to the substrate; and a thermal sensor connected to the substrate.

16 Claims, 4 Drawing Sheets

MICROELECTRONIC PACKAGE INCLUDING TEMPERATURE SENSOR CONNECTED TO THE PACKAGE SUBSTRATE AND METHOD OF FORMING SAME

FIELD OF THE INVENTION

Embodiments of the present invention relate generally to microelectronic packages including temperature sensors, and to methods of forming such packages.

BACKGROUND OF THE INVENTION

State of the art microprocessors are typically equipped with on-die temperature sensors that allow a monitoring and control the die temperature during operation. Such control may in some instances take place via the use of a passive heat sink coupled with a system cooling fan, or including an active heat sink or fan sink. Other arrangements for controlling the die temperature during operation are also well known. Control of the die temperature may be triggered, for example, when the die temperature sensed by the temperature sensor reaches a threshold or activation temperature value, at which point a signal is sent to the heat management arrangement to effect temperature control.

On-die temperature sensors sometimes include thermal diodes located on the edge or corner of the die in order not to interfere with the die's circuitry. Circuitry for the diodes is typically formed along with other circuitry on the die. As a result, disadvantageously, the performance of such thermal diodes may be impacted by the die fabrication process variations, which would then negatively affect the thermal management of the die during operation. In particular, the ideality factor of the thermal diode may vary between different die production lots because of fabrication process variations between those die lots. Such fabrication process variations would typically introduce fabrication process variations as between the diodes on each different unit, which would mean varying performances as between those diodes. As die measurements shrink with advancements in microelectronic fabrication, fabrication process changes as between different die lots are apt to introduce larger and larger temperature measurement errors by the currently used on-die thermal diodes.

In addition, an ideality factor of the same thermal diode on the same die may vary as the temperature of the die changes. For the same diode on a given die, a temperature change of about 75 degrees Celsius can result in a change in the ideality factor of about 0.1, which can negatively impact a performance of the thermal sensor.

A variability of ideality factors can result in appreciable die temperature measurement errors ranging from about 39 to about 85 degrees Celsius when using analog devices to measure the thermal diode temperature. Such errors can negatively impact a control of a heat management arrangement, which control relies on accurate die temperature measurements by the thermal diode. For example, a control of the speed and acoustic noise of a cooling fan may be negatively affected by errors resulting from variations of a thermal diode's ideality factor. A unit by unit calibration of the diodes would clearly be costly and cumbersome, and not suited for high volume manufacturing.

The prior art fails to provide a reliable microelectronic package structure and method to monitor and control a temperature of a die during its operation.

Figure 1:
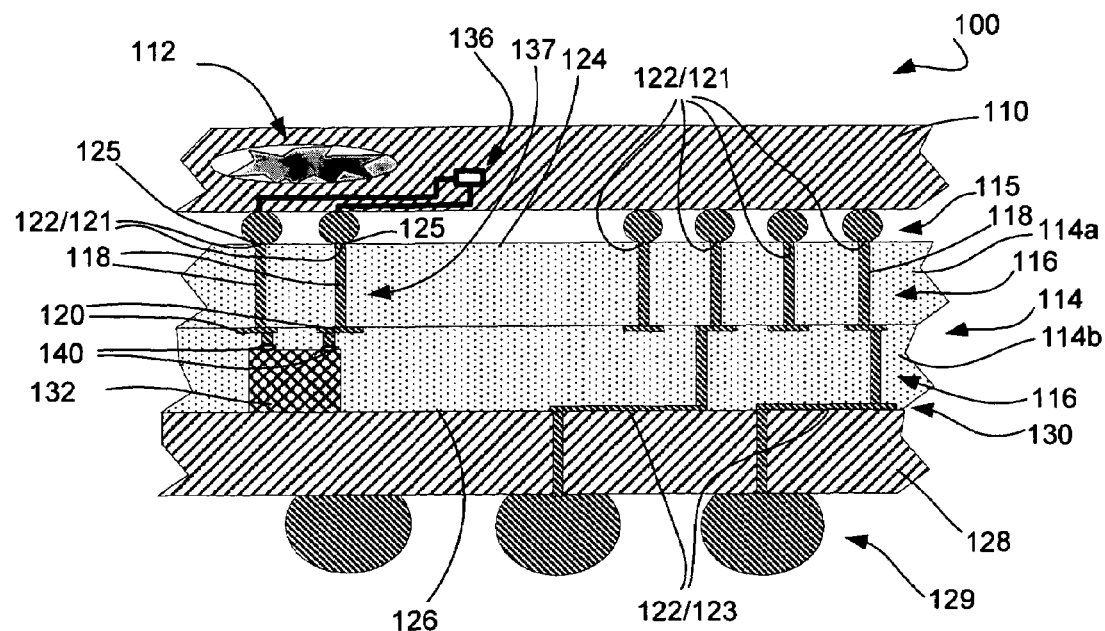
FIG. 1 is a schematic cross-sectional partial view of a package according to a first embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic package, a method of forming the package, and a system incorporating the package are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a microelectronic package is disclosed. In one embodiment, a method of forming the package is disclosed. Aspects of these and other embodiments will be discussed herein with respect to FIGS. 1-6, below. The figures, however, should not be taken to be limiting, as they are intended for the purpose of explanation and understanding.

Referring first to FIG. 1, a partial view of a microelectronic package 100 is shown according to a first embodiment. As seen in FIG. 1, a package may include a die 110 having a hot spot location 112 as shown. Die 110 is shown as having been electrically and mechanically bonded to a substrate 114 via solder joints 115. Optionally, an underfill material (not shown) may be provided in a space between substrate 114 and die 110 in a well known manner. By "hot spot location," what is meant in the context of the instant description is a localized area of the die that dissipates a higher heat flux than other areas of the die, thereby creating a localized area of elevated temperature compared to the other areas of the die. The package shown in FIG. 1 further comprises a substrate 114, which, in the shown embodiment, includes an organic build-up substrate or laminate substrate. However, the substrate according to embodiments need not necessarily be an organic build-up substrate, and may be made of any other material suitable for a microelectronic substrate, as would be recognized by one skilled in the art, such as, for example, a ceramic material. In the shown embodiment, the substrate includes build-up layers 114a and 114b, which may include, for example, polyimides and polyimide laminates, epoxy resins, organic materials, or dielectric materials comprised at least in part of polytetrafluoroethylene, with or without a filler, or any other suitable build-up material as would be within the knowledge of a skilled person. The organic build-up substrate 114 may be made according to well known lamination methods. Substrate 114 as shown includes electrical pathways 116 extending therethrough, the electrical pathways 116 having been provided according to a predetermined interconnection pattern and including combination of vias 118, conductive layers 120, and contacts 122. Contacts 122 include contacts 121 disposed on the die-side surface 124 and contacts 123 disposed the printed-circuit-board side 126 of substrate 114. Contacts 122 allow an electrical interconnection of pathways 116 with circuitry external to the substrate. Thus, electrical pathways 116 allow an interconnection of a die such as die 110 with other microelectronic components. For example, package 100 may be electrically and mechanically bonded to a printed circuit board or PCB 128. In the shown embodiment of FIG. 1, substrate 114 is shown as comprising contacts 123 on its PCB-side 126 which include a land-grid array 130, although embodiments are not so limited. Thus, embodiments comprise within their scope the use of a substrate comprising any configuration of PCB-side contacts including, for example, a ball grid array and a pin grid array, configurations of PCB-side contacts also being possible. PCB 128 as shown in FIG. 1 supports package 100 thereon, and includes an array of solder balls 129 allowing electrical coupling to circuitry outside of the package, and thus allows an electrical interconnection of the die to other microelectronic components.

Referring still to FIG. 1, package 100 further includes a thermal sensor 132 embedded in the substrate 114. The thermal sensor according to embodiments may for example include one of a thermal diode, a thermocouple and a resistance temperature detector. However, a thermal sensor according to embodiments is not limited to the above-referenced examples, and may include any sensor adapted to sense die temperature. According to the instant description, where A is described as "embedded" in B, what is meant is that at least part of the volume of A is encompassed or surrounded by B. In the shown embodiment of FIG. 1, thermal sensor 132 is shown as having almost all of its volume encompassed by the material of the substrate, except for a PCB-side surface thereof as having been left exposed to PCB 128. In addition, embodiments are not limited to a thermal sensor embedded in a substrate, and include within their scope a thermal sensor that is connected to a substrate, such as connected to a surface of the substrate. The thermal sensor 132 may, as shown in the embodiment of FIG. 1, be electrically coupled to some of the contacts 122 on the die-side surface 124 of substrate 114. In the shown embodiment, the thermal sensor 132 is shown as having been placed at a location of the substrate 114 that is a function of the hot spot location 112 of die 110. In the context of the instant description, a location on the substrate is "a function of the hot spot location of the die" where the location is "as close as possible to the hot spot location of the die." The physical closeness of the thermal sensor 132 to the hot spot 112 may be dictated by a number of factors, such as, for example, substrate space availability and ease of electrical connection of the thermal sensor to circuitry outside of the substrate, such as, for example, ease of electrical connection to the die or to the printed circuit board." Embodiments, however, are not limited to a placement of the sensor as a function of the hot spot location of the die, and include within their scope the placement of the sensor anywhere external to the die and on the substrate. According to one embodiment, for example, in the event where the die components dissipate heat in a fairly uniform manner across an active surface of the die, the die may still exhibit a highest temperature at a critical location thereof, such as, for example, at or close to a central region thereof. In such a case, it is within the scope of embodiments to provide a thermal sensor on the substrate as a function of the location of the highest exhibited and/or anticipated temperature of the die, that is, the critical location of the die. According to a preferred embodiment, a thermal sensor is placed closest to the die hot spot or closest to the die critical location without a need for a re-routing of the predetermined electrical pathways within the substrate, that is, without a need to re-route the electrical pathways that would have been in the substrate regardless of the presence of the thermal sensor. Thus, as shown in FIG. 1 for example, since build-up layer 114a is shown as containing a number of through vias 118 as part of the electrical pathways of the substrate 114, the thermal sensor 132 has been embedded in build-up layer 114b. However, if build-up layer 114a as shown did not include the vias 118, a preferred embodiment would have placed the thermal sensor in the build-up layer 114a directly under the solder bumps 115 closest to the hot spot 112.

Referring still to FIG. 1, thermal sensor 132 in the shown embodiment is shown as having been electrically coupled by electrical pathway 134 to heat management circuitry 136 within the die 110 through contacts 125. Contacts 125 are correspond to the part of the contacts 121 allocated to the thermal sensor on the die side surface 124 of substrate 114. The heat management circuitry 136 is part of a heat management arrangement of the die 110, and is coupled to the thermal sensor 132 by way of electrical pathway 137 to control a temperature of the die as a function of a temperature signal from the thermal sensor 132. The heat management circuitry 136 of the die 110 may, for example, include circuitry of the die that is adapted to control an operation of other circuitry of the die in order to control a temperature of the die. Thus, by way of example, heat management circuitry 136 of the die 110 may, in a well known manner, be activated by a signal from the thermal sensor 132 (such as, for example, when the thermal sensor senses a predetermined trigger or threshold temperature) to control die power dissipation by either throttling an operation of a microprocessor of the die or by shifting the microprocessor into idle mode, or, in the alternative, by lowering an operating frequency of the microprocessor.

Figure 2:
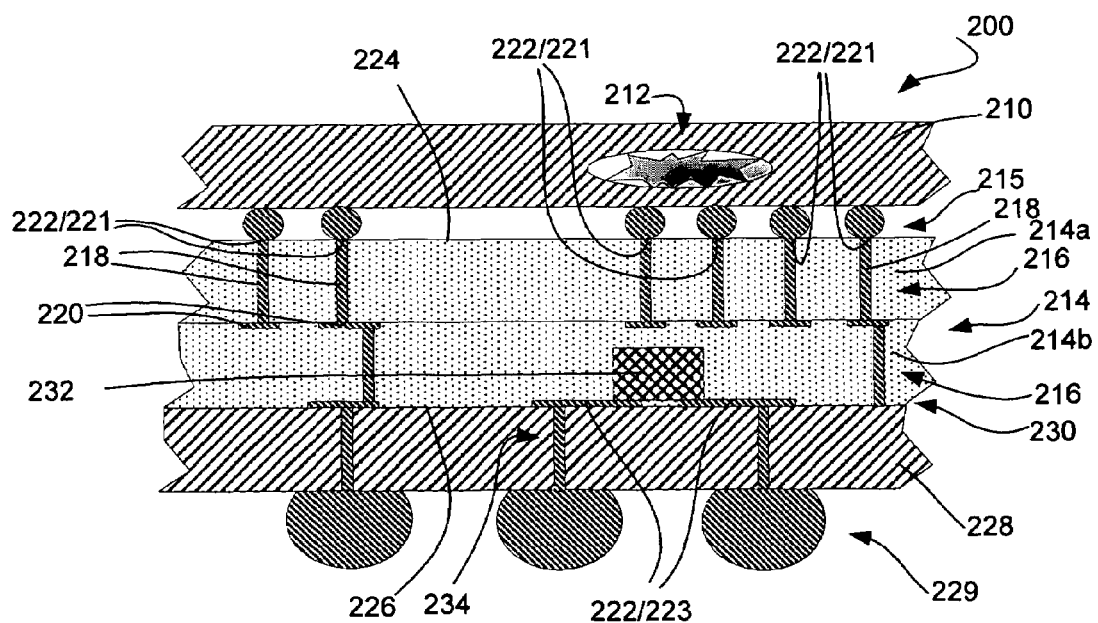
FIG. 2 is a schematic cross-sectional partial view of a package according to a second embodiment.

While the embodiment of FIG. 1 shows a heat management arrangement that includes circuitry of the die, the embodiment of FIG. 2 is similar to that of FIG. 1 except that, there, the heat management arrangement is disposed externally with respect to the die, as will be explained in further detail below. In general, whether integral to the die or external to the die, a heat management arrangement is adapted to keep the die temperature below critical levels in a well known manner.

Thus, referring now to FIG. 2, a partial view of a microelectronic package 200 is shown according to a second embodiment. As seen in FIG. 2, similar to FIG. 1, a package according to the shown embodiment includes a die 210 having a hot spot location 212 as shown and defined above. Die 210 is shown as having been electrically and mechanically bonded to a substrate 214 via solder joints 215 as shown. Optionally, an underfill material (not shown) may be provided in a space between substrate 214 and die 210 in a well known manner. The package shown in FIG. 2 further comprises a substrate 214, which, in the shown embodiment, includes an organic build-up substrate or laminate substrate. However, as explained with respect to FIG. 1, a substrate according to embodiments is not so limited, and may include any suitable substrate as would be recognized by the skilled person. In the shown embodiment, the substrate includes build-up layers 214a and 214b. Substrate 214 as shown includes electrical pathways 216 extending therethrough, the electrical pathways 216 including a combination of vias 218, conductive layers 220, and contacts 222 including contacts 221 disposed on the die-side surface 224 and contacts 223 disposed on the printed-circuit-board side surface 226 of substrate 214. Contacts 222 allow an electrical interconnection of pathways 216 with circuitry external to the substrate. Thus, electrical pathways 216 allow an electrical interconnection of a die such as die 210 with other microelectronic components. For example, package 200 may be electrically and mechanically bonded to a printed circuit board or PCB 228. In the shown embodiment of FIG. 2, similar to the embodiment of FIG. 1, substrate 214 is shown as comprising contacts 223 on its PCB-side 226 which include a land-grid array 230, although, as noted with respect to substrate 114 of FIG. 1, embodiments are not so limited. PCB 228 as shown in FIG. 2 supports package 200 thereon, and includes an array of solder balls 229 allowing electrical coupling to circuitry outside of the package, and this allows an electrical interconnection of the die to other microelectronic components.

Referring still to FIG. 2, package 200 further includes a thermal sensor 232 similar of sensor 132 of FIG. 1 embedded in the substrate 214. In the shown embodiment of FIG. 2, thermal sensor 232 is shown as having all of its volume encompassed by the substrate. As explained above with respect to FIG. 1, embodiments include within their scope a provision of a thermal sensor that is connected to a substrate, that is, connected to a surface of the substrate, without necessarily being embedded therein. The thermal sensor 232 may, as shown in the embodiment of FIG. 2, be electrically coupled to some of the contacts 223 on the PCB-side surface 226 of substrate 214. Similar to the embodiment of FIG. 1, in the embodiment of FIG. 2, the thermal sensor 232 is shown as having been placed at a location of the substrate 214 that is a function of the hot spot location 212 of die 210. Thus, as shown in FIG. 2 for example, since build-up layer 214a is shown as containing a number of through vias 218 as part of the electrical pathways 216 of the substrate 214, the thermal sensor 232 has been embedded in build-up layer 114b at a location of layer 114b closest to the die hot spot 212.

Referring still to FIG. 2, thermal sensor 232 is shown as having been electrically coupled by electrical pathway 234 to contacts 223 on the PCB-side surface 226 of substrate 214. Contacts 223, or PCB-side contacts 223, are shown in the embodiment of FIG. 2 as being electrically connected by way of conductive layers 220 of substrate 214 to solder balls 229 of PCB 228. The solder balls 229 are adapted to establish connection of the thermal sensor via the PCB to circuitry external to package 200, in a well known manner. Thus, an electrical connection of thermal sensor 232 to solder balls 229 of PCB 228 is adapted to allow a control of the temperature of the die through heat management circuitry located outside of package 200, as will be explained in further detail with respect to FIG. 4. It is noted that embodiments contemplate any configuration of contacts where a PCB is used, such contacts not being necessarily limited to solder balls.

While the embodiments of both FIG. 1 and FIG. 2 depict thermal sensors embedded in respective substrates as a function of a location of the die hot spot, it is noted that embodiments are not so limited, and include within their scope an embedding of a thermal sensor at any location of a substrate to sense a temperature of a die bonded to the substrate, or a connection of a thermal sensor at any location at a surface of the substrate to sense a temperature of a die bonded to the substrate. As suggested in the embodiment of FIG. 1, where the heat management arrangement comprises circuitry of the die, a package according to embodiments includes at a minimum the die (including the heat management arrangement), the substrate, and the thermal sensor connected to the substrate. However, as suggested in the embodiment of FIG. 2, where the heat management arrangement is external to the die, a package according to embodiments includes at a minimum the die, the substrate, the thermal sensor connected to the substrate, and, in addition, the heat management arrangement external to the die, as will be explained in further detail below with respect to FIGS. 3 and 4. It is noted in this respect that embodiments are not limited to a heat management arrangement that is strictly either part of the die or external to the die, but include within their scope a package where the heat management arrangement may include heat management circuitry of the die, and, in addition, a heat management component external to the die.

Figure 3:
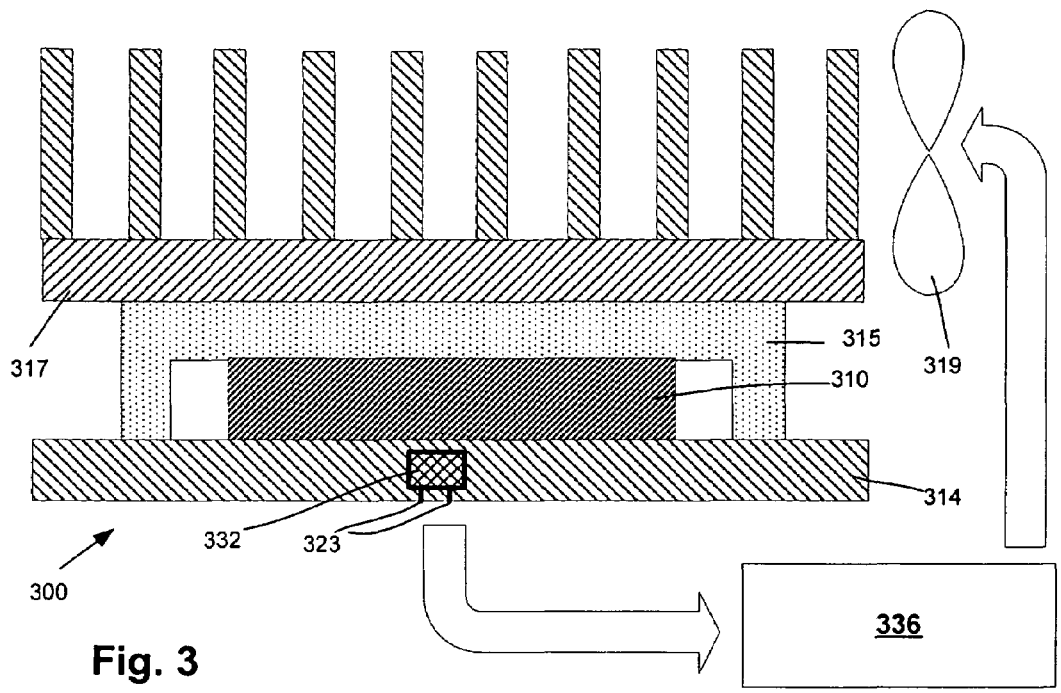
FIGS. 3 and 4 are schematic view of two separate embodiments of a heat management arrangement as part of an embodiment of a package similar to the package of FIG. 2.
Figure 4:
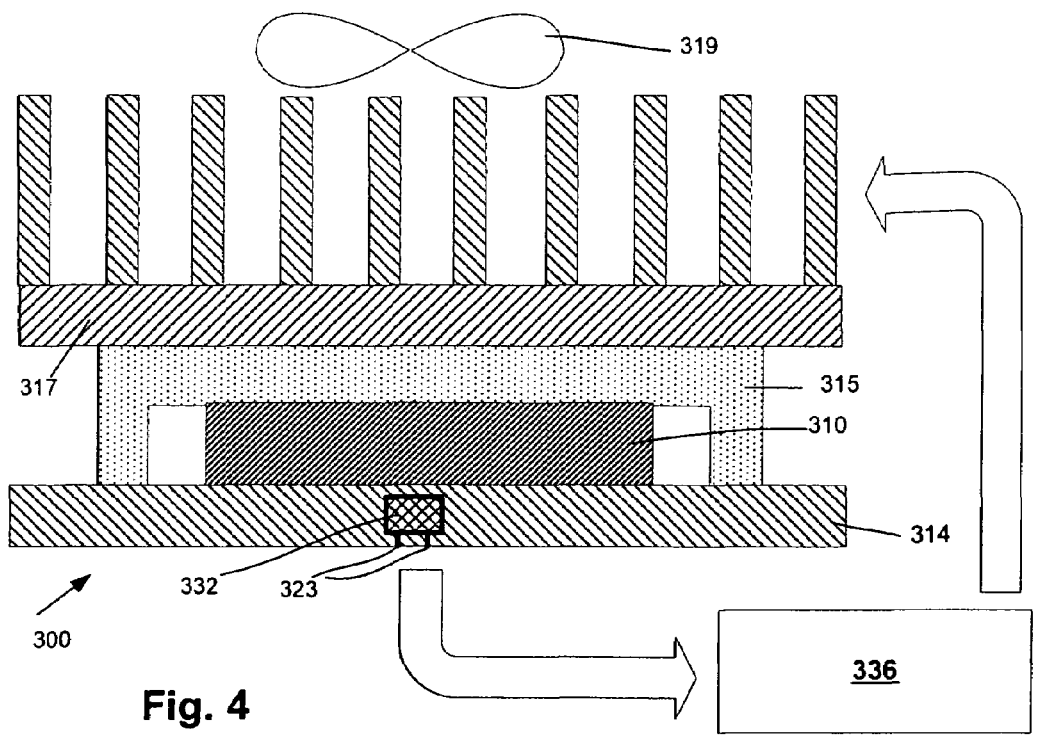

Referring now to FIGS. 3 and 4, two different embodiments are schematically shown of a package including a heat management arrangement external to a die and coupled to a thermal sensor embedded in a substrate. The only difference between the embodiments of FIGS. 3 and 4 is that, in FIG. 3, the heat sink shown is a passive heat sink coupled with a separate cooling fan, while, in FIG. 4, the heat sink is a fan sink including a cooling fan. FIGS. 3 and 4 each include a package 300 which may, for example, be similar to the package 200 of FIG. 2 in the sense that, in package 300, the thermal sensor is electrically coupled to PCB-side contacts 223 of the substrate to be connected to a heat management arrangement external to the die. Thus, package 300 as shown includes a die 310 electrically and mechanically coupled to a substrate 314. A thermal sensor 332 is shown as having been embedded in substrate 314 and electrically coupled to PCB-side contacts 323. Package 300 further includes a heat spreader 315 and a heat sink 317 thermally coupled to the die 310 in a well known manner. In addition, the package includes a heat management arrangement in the form of a cooling fan 319. It is noted that embodiments are not limited to cooling fans, and include within their scope any cooling system activatable and controllable as a function of a temperature sensed by a temperature sensor, such as, for example, a liquid cooling system. In the package 300 of FIGS. 3 and 4, cooling fan 319 is adapted to be electrically coupled to thermal sensor 332 to control a temperature of the die as a function of a temperature signal from the thermal sensor 332. For example, in the shown embodiments of FIGS. 3 and 4, cooling fan 319 is schematically shown as having been coupled to the thermal sensor 332 by way of a logic circuit 336 external to the package 300. The logic circuit 336 may, for example, be similar to logic circuits of the prior art adapted to receive temperature signals from a thermal sensor placed on a die and further adapted to send activation and control signals to a heat management arrangement, such as, for example, a cooling fan similar to cooling fan 319. Thus, the logic circuit may be configured to activate and control a speed of the cooling fan in order to control both die temperature and also to reduce an acoustic noise of the fan.

Figure 5:
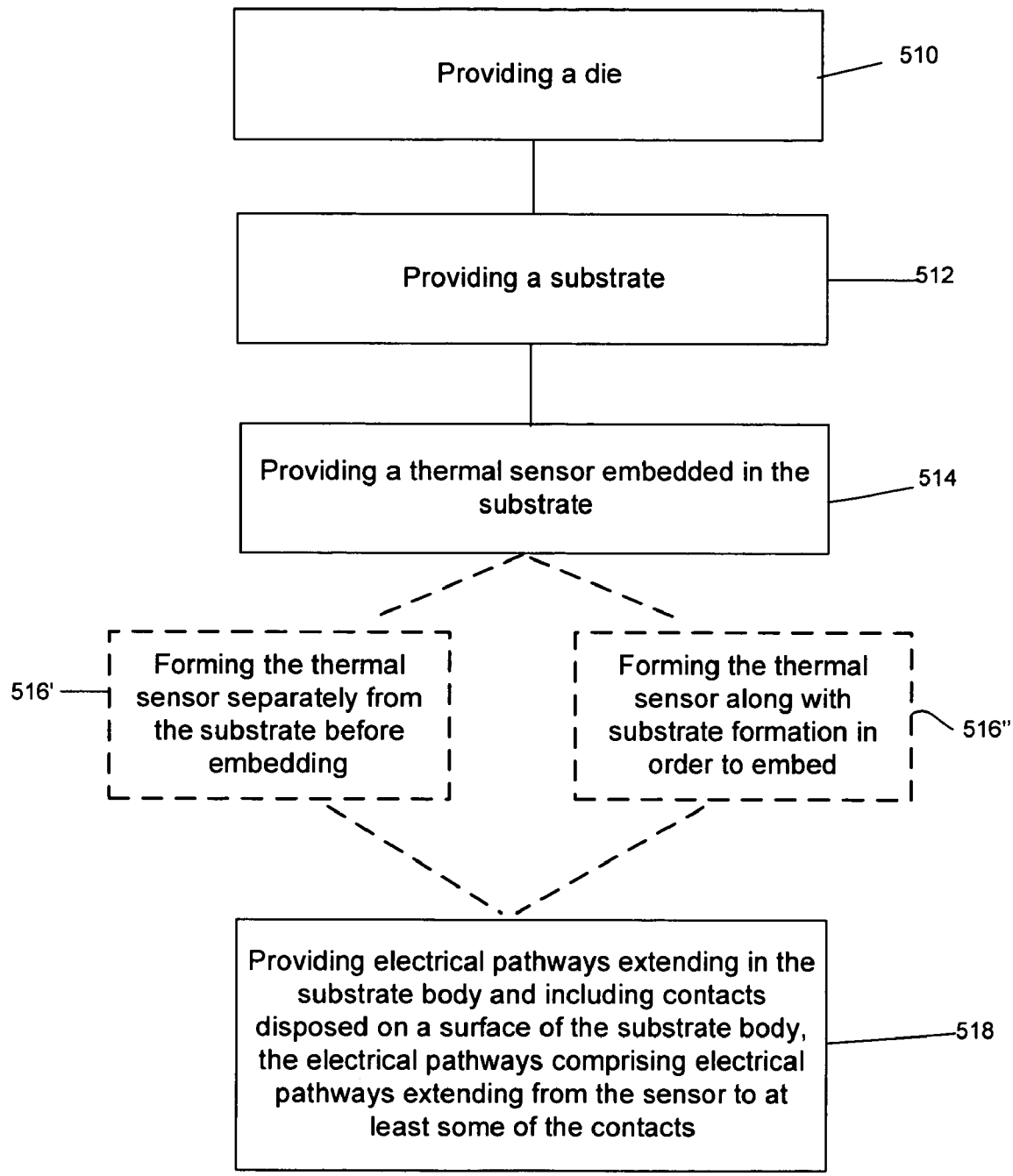
FIG. 5 is a flow diagram of a method embodiment of forming a package.

FIG. 5 shows a diagram of a method according to one embodiment. At block 510, the method embodiment comprises providing a die. At block 512, the method embodiment comprises providing a substrate. At block 514, the method embodiment comprises providing a thermal sensor embedded in the substrate. At block 518, the method embodiment comprises providing electrical pathways extending in the substrate body and including contacts disposed on a surface of the substrate body, the electrical pathways comprising electrical pathways extending from the thermal sensor to at least some of the contacts. At blocks 516' and 516", as shown in broken lines, providing the thermal sensor may comprise either, as shown by block 516', forming the thermal sensor separately from the substrate and then embedding the thermal sensor in the substrate, or, as shown by block 516", forming the thermal sensor along with substrate forming in order to embed the thermal sensor in the substrate. Thus, according to embodiments, the thermal sensor may be formed either separately from the substrate and later embedded therein, or, in the alternative, it may be formed along with the substrate. Where the thermal sensor is formed separately, a cavity may for example be provided in the substrate in a well known manner, such as, for example, by way of laser drilling, mechanical drilling or etching, and the thermal sensor then placed within the cavity and electrically and mechanically bonded to the substrate, such as, for example, by way of soldering, in this way creating solder joints, such as solder joints 140 shown in FIG. 1. Other ways of embedding a separately formed thermal sensor are also within the purview of embodiments. In the alternative, the thermal sensor may be formed along with the substrate. Thus, by way of example, where the substrate is an organic build-up substrate, such as, for example, in the example embodiments of FIGS. 1 and 2, the thermal sensor may be formed (that is, its circuitry may be formed) on build-up layers of the substrate along with a lamination of the build-up layers of the substrate. Other ways of forming a thermal sensor along with the substrate are also within the purview of embodiments. According to an embodiment, a thermal sensor such as those described above may have a thickness between about 75 microns to about 150 microns.

Although exemplary embodiments of a microelectronic package are shown with respect to FIGS. 1-4, embodiments comprise within their scope any package where a thermal sensor adapted to sense a temperature of the die is connected to the substrate. Embodiments further comprise within their scope a substrate adapted to be electrically and mechanically bonded to a die, and including a thermal sensor connected thereto.

Advantageously, embodiments allow the integration of a thermal sensor as a function of die hot spot by allowing connection of the sensor to the substrate, thus obviating limitations imposed by die layout constraints on the placement of the sensor. Because embodiments allow a placement of a thermal sensor connected to a substrate as a function of die hot spots rather than on the edge or corner of the die, embodiments allow the provision of a more accurate temperature reading of the die than would the prior art. In addition, embodiments obviate fabrication process variations of thermal sensors caused by providing thermal sensors on a die by allowing a fabrication of the thermal sensors separately from the die, thus eliminating temperature reading errors associated with die fabrication process variations, and hence facilitating better temperature regulation of the package as a whole. In addition, since embodiments allow the use of sensors different from diodes, such as, for example, thermocouples or RTD's, embodiments allow the choice for a thermal sensor that is not susceptible to ideality factor variations as a function of temperature, in this way allowing an improved temperature management of a microelectronic package.

Figure 6:
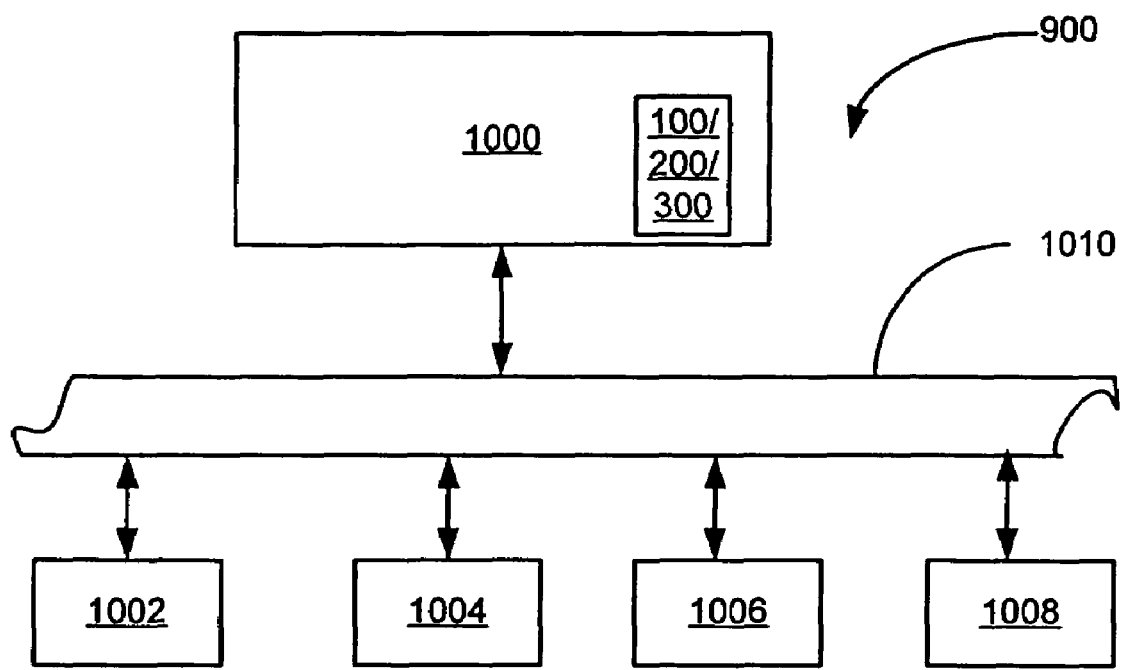
FIG. 6 is a schematic view of a system incorporating a package according to an embodiment.

Referring to FIG. 6, there is illustrated one of many possible systems 900 in which embodiments of the present invention may be used. In one embodiment, the electronic assembly 1000 may include a microelectronic package, such as package 100 of FIG. 1 or package 200 of FIG. 2 or package 300 of FIG. 3. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 6, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package comprising:
   a substrate;
   a die bonded to the substrate;
   a thermal sensor connected to the substrate, wherein the thermal sensor is vertically aligned with a hot spot location of the die; and
   a heat management arrangement one of electrically coupled to the thermal sensor and adapted to be connected to the thermal sensor to control a temperature of the die as a function of a temperature signal from the thermal sensor, wherein the heat management arrangement consists of circuitry that is part of the die, the circuitry is directly electrically coupled to the thermal sensor and adapted to control an operation of other circuitry of the die in order to control a temperature of the die,
   wherein the thermal sensor is embedded in the substrate, the package further comprising electrical pathways extending in the substrate body and including contacts disclosed on a surface of the substrate body, the electrical pathways comprising electrical pathways extending from the thermal sensor to at least some of the contacts.

2. The package of claim 1 wherein the at least some of the contacts are disposed on a die-side of the substrate.

3. The package of claim 1, wherein the at least some of the contacts are disposed on a printed-circuit-board side of the substrate.

4. The package of claim 1, wherein the thermal sensor is connected at a location in the substrate as a function of a hot spot location of the die.

5. The package of claim 1, wherein the heat management arrangement comprises one of a cooling fan and a liquid cooling system disposed to cool the die.

6. The package of claim 1, wherein the thermal sensor is soldered to the substrate.

7. The package of claim 1, wherein the substrate is an organic build-up substrate.

8. A method of forming a microelectronic package comprising:
   providing a die;
   providing a substrate;
   providing a thermal sensor connected to the substrate, wherein the thermal sensor is vertically aligned with a hot spot location of the die; and
   a heat management arrangement one of electrically coupled to the thermal sensor and adapted to be connected to the thermal sensor to control a temperature of the die as a function of a temperature signal from the thermal sensor, wherein the heat management arrangement consists of circuitry that is part of the die, the circuitry is directly electrically coupled to the thermal sensor and adapted to control an operation of other circuitry of the die in order to control a temperature of the die, wherein providing a thermal sensor comprises providing a thermal sensor embedded in the substrate, the method further comprising providing electrical pathways extending in the substrate body and including contacts disposed on a surface of the substrate body, the electrical pathways comprising electrical pathways extending from the thermal sensor to at least some of the contacts.

9. The method of claim 8 wherein providing a thermal sensor comprises:
forming the thermal sensor separately from the substrate; and
embedding the thermal sensor in the substrate.

10. The method of claim 9, wherein embedding the thermal sensor comprises:
providing a cavity in the substrate;
placing the thermal sensor in the cavity; and
establishing an electrical connection between the thermal sensor and the substrate.

11. The method of claim 9, wherein:
the substrate is an organic build-up substrate; and
providing a thermal sensor comprises providing the thermal sensor on build-up layers of the substrate during a fabrication of the substrate.

12. The method of claim 8 wherein:
the substrate is an organic build-up substrate; and
providing a thermal sensor comprises forming the thermal sensor on build-up layers of the substrate during a fabrication of the substrate.

13. The method of claim 8 wherein providing a thermal sensor comprises embedding the thermal sensor at a location in the substrate which is a function of a hot spot location of the die.

14. The method of claim 8 wherein the heat management arrangement comprises one of a cooling fan and a liquid cooling system disposed to cool the die.

15. A system comprising:
a microelectronic package comprising:
a substrate;
a die bonded to the substrate; and
a thermal sensor connected to the substrate; and
a graphics processor coupled to the package, wherein the thermal sensor is vertically aligned with a hot spot location of the die; and
a heat management arrangement one of electrically coupled to the thermal sensor and adapted to be connected to the thermal sensor to control a temperature of the die as a function of a temperature signal from the thermal sensor, wherein the heat management arrangement consists of circuitry that is part of the die, the circuitry is directly electrically coupled to the thermal sensor and adapted to control an operation of other circuitry of the die in order to control a temperature of the die,
wherein the thermal sensor is embedded in the substrate, the package further comprising electrical pathways extending in the substrate body and including contacts disposed on a surface of the substrate body, the electrical pathways comprising electrical pathways extending from the thermal sensor to at least some of the contacts.

16. The system of claim 15, wherein the thermal sensor is embedded at a location in the substrate which is a function of a hot spot location of the die.

* * * * *